May 20, 1969 H. G. SCHOLER 3,444,614

METHOD OF MANUFACTURING SEMICONDUCTOR DEVICES

Filed Jan. 12, 1966

INVENTOR.
HENRY G. SCHOLER
BY [signature]
ATTORNEY 3,444,614

METHOD OF MANUFACTURING SEMICONDUCTOR DEVICES

Henry G. Scholer, Carteret, N.J., assignor to The Bendix Corporation, Eatontown, N.J., a corporation of Delaware Filed Jan. 12, 1966, Ser. No. 520,251
Int. Cl. B01j *17/00;* H01l *1/10*
U.S. Cl. 29—588 5 Claims

ABSTRACT OF THE DISCLOSURE

Means for mass production of semiconductors utilizing mounting the semiconductor wafers on a strip which serves as one of the contacts and also as a heat sink.

The present invention relates to the manufacture of semiconductor devices and particularly to the mass production of encapsulated semiconductor devices.

Heretofore, semiconductor devices have been fabricated individually. Further, the construction is such as to require many hand operations which increases the cost of the device.

The present invention provides means for mass production of semiconductors utilizing mounting the semiconductor wafer on a strip which serves as one of the contacts and also as a heat sink. This method not only reduces the handling, but also eliminates several parts normally used.

It is an object of the invention to provide a novel method for fabricating semiconductors.

Another object of the invention is to provide an inexpensive method for fabricating semiconductor devices.

The above and other objects and features of the invention will appear more fully hereinafter from a consideration of the following description taken in connection with the accompanying drawing wherein one example is illustrated by way of example.

Figures 1, 2:
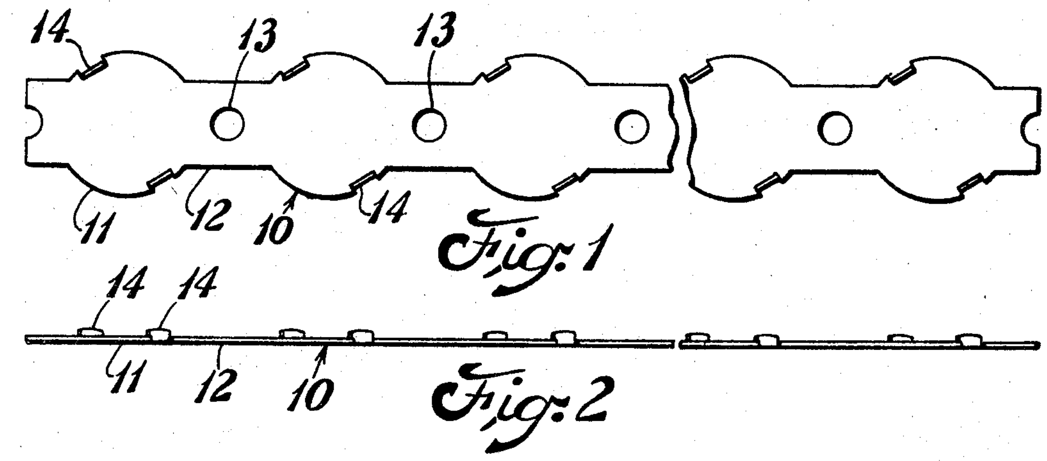
FIGURE 1 is a top view of a platform strip utilized in the invention.
FIGURE 2 is a side view of the platform strip of FIGURE 1.

Referring now to FIGURES 1 and 2 of the drawing, a strip 10 of a suitable metal, for example silver, is punched or otherwise formed to provide a plurality of mounting sections 11 with a predetermined space 12 between each mounting section 11. Holes 13 are provided in the space 12 and positioned equidistant from the adjacent mounting sections 11. Tabs 14 are formed on the mounting sections 11, for subsequent anchoring of encapsulation means.

Figures 3, 4, 5, 6:
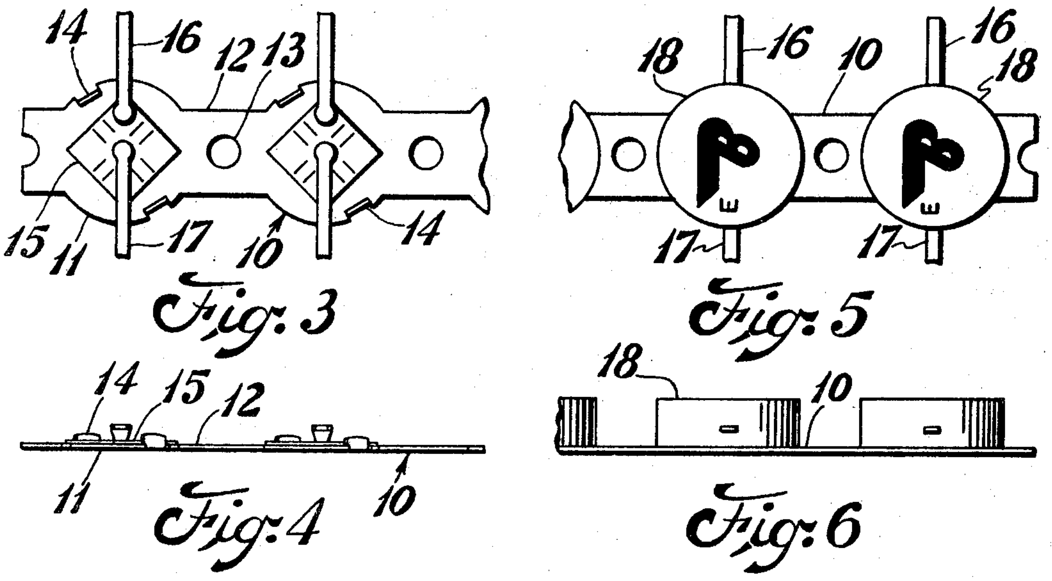
FIGURE 3 is a top view of the platform strip with a semiconductor element mounted thereon.
FIGURE 4 is a side view of the strip and element of FIGURE 3.
FIGURE 5 is a top view of the platform strip with the element encapsulated.
FIGURE 6 is a side view of the strip and element of FIGURE 5.

Next, see FIGURES 3 and 4. Dies of semiconductor material 15 in which rectifying junctions have been formed by conventional means are positioned on the mounting sections 11. The dies 15 may be a silicon mesa transistor, a diffused transistor, an alloy transistor, SCR's, or a diode, as examples. In mounting the dies 15, the strip 10 is fed through a suitable fixture containing matching positions for aligning the strip 10. A second fixture is used for loading terminals 16 and 17 and dies 15. The terminals 16 and 17 and the dies 15 are held in position by vacuum. The second fixture is moved into position relative to the first fixture and the parts released in proper position. The loaded first fixture is then fired in a furnace for thermally joining the assembly, using suitable material predeposited on the components prior to firing. After removal from the furnace and while still in the fixture, the devices are etched, cleaned and dried. The strip assembly is then transferred into another fixture and electronic tests are made thereon. Any strip rejected by the test is returned for reprocessing.

After testing, the junctions on the die are passivated by applying a moisture free, non-conductive, high purity coating, for example silicon varnish, over the active junction. The strip assemblies are then transferred to a curing and bake out stage. The cured strip assemblies are loaded in a molding press and the dies encapsulated with a suitable epoxy or plastic 18. All units in a strip are then tested in one operation and the results accumulated on a tape strip and both sent to a segregation station.

Figure 7:
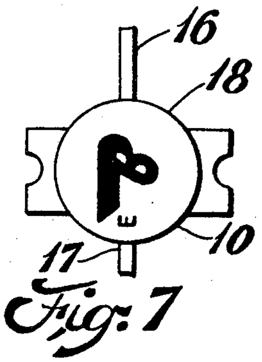
FIGURES 7 and 8 are top and side views of a completed device.
Figure 8:
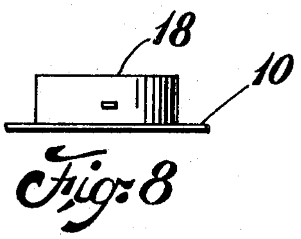

At the segregation station the tape selects the units according to selected parameters and on each unit is cut from the strip (see FIGURE 7) and by appropriating gating is deposited into magazines according to classification. The magazines are color coded to indicate the classification and after the magazine is loaded, the devices therein are color coded to correspond to their magazines. By virtue of the color coded arrangement, it is easy to control the products in accordance with their parameters.

Although only one embodiment of the invention has been illustrated and described, various changes in the form and relative arrangement of the parts, which will now appear to those skilled in the art, may be made without departing from the invention.

What is claimed is:

1. A method of manufacturing semiconductor devices comprising the steps of:

(a) forming a metallic strip to provide a plurality of equal spaced mounting sections,
(b) preparing a plurality of dies of semiconductor material with rectifying junction therein,
(c) placing said dies of semiconductor material on said mounting sections,
(d) positioning terminals in contact with said dies of semiconductor material,
(e) firing the aforesaid assembly to thermally join said dies to said strip and said terminals to said dies,
(f) passivating the junctions in said dies, and
(g) encapsulating said dies.

2. The combination as set forth in claim 1 in which each unit is cut from the strip to form a semiconductor device.

3. The combination as set forth in claim 1 in which the dies of semiconductor material are transistors.

4. The combination as set forth in claim 1 in which the dies of semiconductor material are diodes.

5. The combination as set forth in claim 1 in which passivating the junctions in said dies includes painting with silicon varnish.

(References on following page)

References Cited

UNITED STATES PATENTS

| | | | |
|---|---|---|---|
| 2,748,235 | 5/1956 | Wallace | 29—574 X |
| 2,960,640 | 11/1960 | Emeis. | |
| 3,037,155 | 5/1962 | Zielasek. | |
| 3,092,522 | 6/1963 | Knowles et al. | |
| 3,092,893 | 6/1963 | Cornelison et al. | 29—591 |
| 3,171,187 | 3/1965 | Ikeda et al. | 29—574 |
| 3,176,376 | 4/1965 | Kelley | 29—589 X |
| 3,199,004 | 8/1965 | Dickson. | |
| 3,281,628 | 10/1966 | Bauer et al. | 29—588 X |
| 3,235,937 | 2/1966 | Lanzl et al. | 29—588 X |
| 3,264,712 | 8/1966 | Hayashi et al. | 29—588 |
| 3,308,525 | 3/1967 | Tsuji et al. | 29—588 |

CHARLIE T. MOON, *Primary Examiner.*

U.S. Cl. X.R.

29—591